United States Patent
Wimplinger

(10) Patent No.: US 10,083,854 B2
(45) Date of Patent: Sep. 25, 2018

(54) METHOD AND DEVICE FOR SURFACE TREATMENT OF SUBSTRATES

(71) Applicant: EV Group E. Thallner GmbH, St. Florian am Inn (AT)

(72) Inventor: Markus Wimplinger, Ried (AT)

(73) Assignee: EV Group E. Thallner GmbH, St. Florian am Inn (AT)

(*) Notice: Subject to any disclaimer, the term of this patent is extended or adjusted under 35 U.S.C. 154(b) by 1 day.

(21) Appl. No.: 15/315,900

(22) PCT Filed: Jun. 24, 2014

(86) PCT No.: PCT/EP2014/063303
§ 371 (c)(1),
(2) Date: Dec. 2, 2016

(87) PCT Pub. No.: WO2015/197112
PCT Pub. Date: Dec. 30, 2015

(65) Prior Publication Data
US 2017/0098572 A1    Apr. 6, 2017

(51) Int. Cl.
*H01L 21/762* (2006.01)
*C23C 14/48* (2006.01)

(52) U.S. Cl.
CPC ........ *H01L 21/76251* (2013.01); *C23C 14/48* (2013.01)

(58) Field of Classification Search
CPC ... C23C 14/221; C23C 14/0031; H01L 21/02; H01L 21/02592
See application file for complete search history.

(56) References Cited

U.S. PATENT DOCUMENTS

| 5,441,776 | A | 8/1995 | Sterling et al. | 428/1 |
| 5,641,380 | A * | 6/1997 | Yamazaki | H01L 21/32137 257/E21.312 |
| 6,228,766 | B1 * | 5/2001 | Fujii | H01L 21/28518 257/E21.165 |
| 6,245,622 | B1 * | 6/2001 | Kawaguchi | H01L 21/26506 438/305 |
| 6,391,751 | B1 * | 5/2002 | Wu | H01L 21/28123 257/E21.206 |
| 6,399,485 | B1 * | 6/2002 | Hatano | H01L 21/28518 257/E21.165 |
| 7,462,552 | B2 | 12/2008 | Tong et al. | 438/458 |
| 7,550,366 | B2 | 6/2009 | Suga et al. | 438/455 |

(Continued)

FOREIGN PATENT DOCUMENTS

| EP | 2 646 193 A1 | 10/2013 | |
| EP | 2 672 509 A1 | 12/2013 | H01L 21/02 |

(Continued)

OTHER PUBLICATIONS

International Search Report from corresponding International Patent Application No. PCT/EP2014/063303 dated Aug. 18, 2014.

*Primary Examiner* — Jaehwan Oh
(74) *Attorney, Agent, or Firm* — Kusner & Jaffe

(57) ABSTRACT

A method for surface treatment of an at least primarily crystalline substrate surface of a substrate such that by amorphization of the substrate surface, an amorphous layer is formed at the substrate surface with a thickness d>0 nm of the amorphous layer. This invention also relates to a corresponding device for surface treatment of substrates.

15 Claims, 3 Drawing Sheets

(56) References Cited

U.S. PATENT DOCUMENTS

| | | | |
|---|---|---|---|
| 9,067,363 B2 | 6/2015 | Martinschitz et al. | |
| 2003/0141502 A1* | 7/2003 | Tong | H01L 21/02052 |
| | | | 257/52 |
| 2007/0072391 A1* | 3/2007 | Pocas | H01L 21/187 |
| | | | 438/455 |
| 2007/0099404 A1* | 5/2007 | Govindaraju | H01L 21/26506 |
| | | | 438/520 |
| 2007/0128825 A1 | 6/2007 | Suga et al. | 438/455 |
| 2011/0033630 A1* | 2/2011 | Naik | C04B 41/52 |
| | | | 427/452 |
| 2011/0308583 A1* | 12/2011 | Joshi | H01L 31/03682 |
| | | | 136/255 |
| 2013/0340819 A1* | 12/2013 | Kuznicki | H01L 31/028 |
| | | | 136/255 |
| 2014/0154867 A1 | 6/2014 | Martinschitz et al. | 438/455 |
| 2014/0193979 A1* | 7/2014 | Or | H01L 21/02057 |
| | | | 438/714 |
| 2014/0196842 A1 | 7/2014 | Martinschitz et al. | |
| 2016/0071817 A1 | 3/2016 | Rebhan | H01L 24/83 |

FOREIGN PATENT DOCUMENTS

| | | | | |
|---|---|---|---|---|
| JP | H11-330185 A | 11/1999 | | |
| JP | 2013-251405 A | 12/2013 | | |
| JP | 2014-511278 A | 5/2014 | | |
| WO | 2013/029656 A1 | 3/2013 | | H01L 21/60 |
| WO | WO 2013/110315 A1 | 8/2013 | | |
| WO | 2015/000527 A1 | 1/2015 | | H01L 21/60 |
| WO | 2015/149846 A1 | 10/2015 | | H01L 21/02 |

\* cited by examiner

METHOD AND DEVICE FOR SURFACE TREATMENT OF SUBSTRATES

FIELD OF THE INVENTION

This invention relates to a method for surface treatment of a substrate surface as well as a corresponding device for surface treatment of a substrate surface.

BACKGROUND OF THE INVENTION

In the semiconductor industry, different bonding technologies have already been used for several years in order to connect substrates to one another. The connecting process is called bonding. A rough distinction is made between the temporary bonding method and the permanent bonding method.

In the temporary bonding method, a product substrate is bonded to a carrier substrate in such a way that after processing, it can be detached again. Using the temporary bonding method, it is possible to stabilize a product substrate mechanically. The mechanical stabilization ensures that the product substrate can be handled without curving, deforming, or breaking. Stabilizations by carrier substrates are primarily necessary during and after a back-thinning process. A back-thinning process makes it possible to reduce the product substrate thickness to a few micrometers.

In the permanent bonding method, two substrates are bonded to one another continuously, i.e., permanently. The permanent bonding of two substrates also makes it possible to produce multi-layer structures. These multi-layer structures can be comprised of the same or different materials. Different permanent bonding methods exist.

The permanent bonding method of the anodic bonding is used in order to connect ion-containing substrates permanently to one another. In most cases, one of the two substrates is a glass substrate. The second substrate is preferably a silicon substrate. In the method, an electric field is applied along the two substrates that are to be bonded to one another. The electric field is produced between two electrodes, which preferably bring the two surfaces of the substrates into contact. The electric field produces an ion transport in the glass substrate and forms a space charge zone between the two substrates. The space charge zone produces a strong attraction of the surfaces of the two substrates, which ensure contact with one another after the approach and thus form a permanent connection. The bonding method is thus based primarily on the maximization of the contact surface of the two surfaces.

Another permanent bonding method is the eutectic bonding. During eutectic bonding, an alloy is produced with a eutectic concentration or is set during the bonding. By exceeding the eutectic temperature, the temperature at which the liquid phase is in equilibrium with the solid phases of the eutectic, the eutectic melts completely. The liquid phase of the eutectic concentration that is produced wets the surface of the areas that are still not liquefied. During the solidification process, the liquid phase solidifies to form the eutectic and forms the connecting layer between the two substrates.

Another permanent bonding method is the fusion bonding. In the case of fusion bonding, two flat, pure substrate surfaces are bonded to one another by making contact. In this case, the bonding process is divided into two steps. In a first step, the two substrates are brought into contact. In this case, the attachment of the two substrates is carried out primarily by van der Waals forces. The attachment is referred to as a prebond. These forces make it possible to produce an attachment, which is strong enough to bond the substrates tightly to one another in such a way that a mutual shifting, in particular by the application of a shearing force, is possible only with a considerable expenditure of energy. In contrast, the two substrates, in particular by applying normal force, can be relatively easily separated from one another again. The normal forces in this case preferably engage on the edge in order to produce a wedging action in the boundary surface of the two substrates, which produces a continuous crack and thus separates the two substrates from one another again. In order to produce a permanent fusion bond, the substrate stacks are subjected to a heat treatment. The heat treatment results in forming covalent connections between the surfaces of the two substrates. Such a permanent bond that is produced is only possible by the use of a correspondingly high force that in most cases accompanies a destruction of the substrates.

The publication U.S. Pat. No. 5,441,776 describes a method for bonding first electrode to a hydrogenated, amorphous silicon layer. This amorphous silicon layer is deposited by deposition processes on the surface of a substrate.

The publication U.S. Pat. No. 7,462,552 B2 shows a method in which a chemical gas phase deposition (Chemical Vapor Deposition, CVD) is used in order to deposit an amorphous silicon layer at the surface of a substrate. The amorphous layer has a thickness of between 0.5 and 10 μm.

In their publication U.S. Pat. No. 7,550,366 B2, Suga et al. report on an accidentally produced amorphous layer, which is approximately 100 nm thick. This amorphous layer is located between the two substrate surfaces, which were prepared by a surface-activation process. The amorphous layer is a by-product of the ion bombardment of the substrate surface with inert gas atoms and metal atoms. The actual bonding process thus takes place between iron atoms, which cover the amorphous layer.

The heat treatment represents another technical problem. The bonded substrates have very often already been provided with functional units, such as, for example, microchips, MEMs, sensors, and LEDs, which have a temperature sensitivity. In particular, microchips have a relatively strong doping. At elevated temperatures, the doping elements have an elevated diffusivity, which can result in an undesirable, disadvantageous distribution of the dopings in the substrate. In addition, heat treatments are always associated with elevated temperatures and thus also with higher costs, with the production of thermal voltages, and with extended process times for heating and cooling. In addition, bonding is to be done at the lowest possible temperatures in order to prevent shifting of different substrate areas, which are comprised of different materials and thus in general also of different thermal expansion coefficients.

A plasma treatment for purification and activation of a substrate surface would be an option for bonding at relatively low temperatures. Such plasma methods do not work or work only very poorly, however, in the case of oxygen-affine surfaces, in particular in the case of metal surfaces. The oxygen-affine metals oxidize and in general form relatively stable oxides. The oxides are in turn an obstacle for the bonding process. Such metals can also be bonded to one another with relative difficulty by diffusion bonding. The bonding of plasma-activated, in particular monocrystalline, silicon, which forms a silicon dioxide layer, works very well, however. The silicon dioxide layer is extremely well suited for bonding. The above-mentioned negative effects of the oxides therefore do not necessarily relate to all classes of materials.

The literature contains several approaches that describe direct bonding at lower temperatures. One approach in PCT/EP2013/064239 includes applying a sacrificial layer, which is dissolved in substrate material during and/or after the bonding process. Another approach in PCT/EP2011/064874 describes the production of a permanent connection by phase conversions. The above-mentioned publications relate in particular to metal surfaces, which are more likely bonded via a metal bond and not via covalent bonds. In PCT/EP2014/056545, an optimized direct bonding process of silicon by a surface purification is described.

The surface roughness of the surfaces/contact surfaces to be bonded represents another problem. In particular, when removing oxides and contaminants from the surfaces of the substrates that are to be bonded with one another with known methods, frequently a higher level of roughness is produced. On the microscopic scale, this roughness prevents full contact between the two surfaces during the bonding process, which has an adverse effect on the effective bonding strength. The two substrate surfaces bond almost overwhelmingly on tangent surface maximum points. Therefore, in particular, a contrast exists between good purification and provision of a surface that is as ideal as possible.

In the semiconductor industry, in particular substances or materials of the same type are to be connected to one another. The type similarity ensures that the same physical and chemical properties are present across the connecting point. This is in particular important for connections, across which electrical current is to be conducted, which are to have a low tendency toward corrosion and/or the same mechanical properties. Among these substances of the same type, primarily the following are found:

Copper-copper
Aluminum-aluminum
Tungsten-tungsten
Silicon-silicon
Silicon oxide-silicon oxide Some of the metals used in the semiconductor industry are oxygen-affine. Thus, under an oxygen-containing atmosphere, aluminum forms a relatively solid aluminum oxide. During bonding, such oxides have a negative effect on the bonding result, since they are trapped between the two materials that are to be bonded to one another. Under extreme conditions, such an oxide can completely prevent a bonding process; under the most optimal conditions, the oxide is trapped. A mechanical breaking of the oxide layer before the incorporation is also conceivable. The oxide is thermodynamically stable enough not to decompose or to go into solid solution. It remains as oxide in the bonding boundary surface and has a negative effect on the mechanical properties there. Similar problems arise for tungsten and/or copper bonds.

SUMMARY OF THE INVENTION

It is therefore the object of this invention to indicate a method and a device with which an optimal connection is achieved at the lowest possible temperature, in particular with the greatest possible purity at the bonding boundary surface.

This object is achieved with the features of the independent claim(s). Advantageous further developments of the invention are indicated in the subclaims. Also, all combinations that include at least two of the features indicated in the specification, the claims and/or the figures fall within the scope of the invention. In the indicated ranges of values, values as boundary values that lie within the above-mentioned limits are also to be considered as disclosed and can be claimed in any combination.

The basic idea of this invention is to produce an in particular primarily amorphized layer with a defined thickness d at a substrate surface that is to be bonded. In this case, the amorphized layer can be applied to the substrate in particular by chemical and/or physical deposition processes, preferably sputtering, or can be produced directly from the substrate. A main aspect of the invention is in the fact, however, that the amorphized layer is not made by a material applied by means of physical and/or chemical processes but rather results from a phase conversion of the substrate material. As a result, the deposition of material that is in particular accidental or harmful can be completely eliminated. Hereinafter, therefore, primarily the second method is presented in detail.

The invention relates in particular to a method for permanent bonding of two substrates, of which at least one, preferably two, was/were treated before the bonding as described below. Surface areas, in particular a contact side (preferably over the entire surface) of the two substrates or of at least one of the two substrates, are amorphized before the bonding process. Hereinafter in the patent specification, the entire substrate surface is described as an amorphized surface area, although according to the invention, the amorphization of surface areas, in particular separate from one another, which are smaller than the substrate surface, is conceivable. By the amorphization, a nanometer-thick layer is produced, in which the atoms of at least one of the surfaces to be bonded (contact sides) are arranged randomly. This random arrangement results in a better bonding result, in particular in the case of comparatively low temperatures. To produce a bond according to the invention, in particular a purification of the surfaces (at least the contact sides), in particular for releasing oxides, is performed. Purification and amorphization preferably occur simultaneously, even more preferably by the same treatment. A significant aspect of the invention according to the invention is in particular the use of low-energy particles, in particular ions, whose energy is comparatively low but is sufficient to produce the amorphization described according to the invention.

The removal of oxide from the substrate surfaces is advantageous for an optimal bonding process and a substrate stack with correspondingly higher bonding strength. This applies in particular for all materials in which an oxygen-containing atmosphere forms an accidental native oxide. This does not necessarily apply for deliberately produced oxygen substrate surfaces such as, for example, for silicon oxide. In particular, oxides according to the invention—preferably at least predominantly, even more preferably exclusively, harmful, unnecessary and/or native, in particular metal oxides—are removed. Preferably, the above-mentioned oxides are removed to a very large extent, in particular completely, before a bonding process in order not to be incorporated into the bonding boundary surface (contact surface of two substrates). An incorporation of such oxides would lead to a mechanical destabilization and to a very low bonding strength. The removal of the oxide is carried out by physical or chemical methods In an especially preferred embodiment according to the invention, the removal of the unwanted oxides is carried out with the same unit by which the method according to the invention is implemented. As a result, the following can be simultaneously performed, in particular under optimal circumstances:
Oxide removal
Surface smoothing
Amorphization In alternative embodiments according to the invention, the oxide removal is not carried out in the same unit.

In this case, it must be ensured in particular that no renewed oxidation of the substrate surfaces occurs during transfer of the substrates between the two units.

In other words, the idea according to the invention includes in particular in the increase in bonding strength between two substrate surfaces by amorphization. In this case, the amorphization solves several problems:

In the first place, the amorphization according to the invention preferably precedes a purification of the substrate surface. In particular, purification of the substrate surface and amorphization are performed simultaneously, even more preferably by the same process.

In the second place, the amorphization according to the invention produces a planarization of the substrate surface. In this case, the planarization takes place during the amorphization, in particular in addition by the action of a force that acts during the bonding process.

In the third place, a thermodynamically metastable state at the substrate surface (bonding boundary surface) is produced by the amorphization. In another process step (in particular after the surfaces to be bonded make contact), a (back) conversion of partial areas of the amorphous layer into a crystalline state results in this metastable state. In the ideal case, a complete conversion of the amorphous layer is carried out. The resulting layer thickness after making contact and the subsequent heat treatment of the amorphous layer are in particular greater than zero.

One idea according to the invention is primarily the production of the amorphous layer that is comprised of the existing basic material of the substrate, in particular by particle bombardment. Preferably, before the bonding of the substrates, no material is applied to the substrate surfaces to be bonded.

The method according to the invention makes possible the production of a complete and/or full-surface, in particular mixed, contact of two substrate surfaces, of which at least one, preferably two, is/are amorphized according to the invention. Contaminants, inclusions, voids and bubbles are completely avoided by the complete contact.

The method according to the invention is used in particular for the production of a contact that is complete and/or full-surface and/or unmixed of two, preferably different, substrate surfaces. In particular, the following materials can be bonded to one another in any combination.
Metals, in particular
Cu, Ag, Au, Al, Fe, Ni, Co, Pt, W, Cr, Pb, Ti, Te, Sn, Zn
Alloys
Semiconductors (with corresponding doping), in particular
Element semiconductors, in particular
Si, Ge, Se, Te, B, □-Sn
Compound semiconductors, in particular
GaAs, GaN, InP, InxFGal-xN, InSb, InAs, GaSb, AlN, InN, GaP, BeTe, ZnO, CuInGaSe2, ZnS, ZnSe, ZnTe, CdS, CdSe, CdTe, Hg(1-x)Cd(x)Te, BeSe, HgS, AlxGal-xAs, GaS, GaSe, GaTe, InS, InSe, InTe, CuInSe2, CuInS2, CuInGaS2, SiC, SiGe
Organic semiconductors, in particular
Flavanthrone, perinone, Alq3, perinone, tetracene, quinacridone, pentacene, phthalocyanines, polythiophenes, PTCDA, MePTCDI, acridone, indanthrone The following material combinations according to the invention are preferably used:
GaN—Cu,
GaAs—SiO2,
Cu—Al.

Although the embodiment according to the invention is suitable primarily for connecting two substrate surfaces that are made of different materials, hereinafter in the patent, reference is made primarily to the connection of two substrate surfaces of the same type for the sake of simplicity. In other words, the invention relates in particular to a method for direct bonding. In this case, the invention is preferably based on the idea of amorphizing at least one surface (arranged in particular on the contact side) of a substrate before the bonding process. The amorphization is preferably carried out not by the deposition of a material that is amorphously resublimated respectively condensed under the given deposition parameters at the substrate surface but rather in particular by an alteration, primary forming and/or phase conversion of an amorphous layer at the substrate surface. This is done in particular by the introduction of kinetic energy by particle bombardment, in particular ion bombardment, most preferably by a low-energy ion bombardment.

Amorphization

The amorphization is defined as the random arrangement of atoms in contrast to the well-defined arrangement of atoms in a crystal. The atoms can be the atoms of a one-atomic single-component system, a multi-atomic single-component system, a one-atomic multi-component system or a multi-atomic multi-component system. Component is defined as an independently variable material component of a phase. The amorphous phase has in particular no short-range order and/or no long-range order. An at least partially amorphous structure of the amorphous layer that is designed according to the invention is defined as a phase batch, which includes at least one amorphous phase and a crystalline phase. Reference is to be made to the volume ratio between the amorphous phase and the total volume as the degree of amorphization. According to the invention, the degree of amorphization is in particular greater than 10%, preferably greater than 25%, even more preferably greater than 50%, most preferably greater than 75%, and all the more preferably greater than 99%.

The amorphization according to the invention is limited in particular to the area that is near the surface of the substrates that are to be bonded to one another, preferably by selection of the process parameters temperature, pressure, ionization energy and/or ion current density during the amorphization. In particular, the material of the substrate, in this case apart from the amorphized layer according to the invention, remains at least primarily, preferably completely, crystalline.

In a first embodiment according to the invention, only the substrate surface of a first substrate is amorphized. The thickness d of the amorphous layer immediately after the production according to the invention in a substrate surface is in particular less than 100 nm, preferably less than 50 nm, more preferably less than 10 nm, most preferably less than 5 nm, and all the more preferably less than 2 nm.

In accordance with a further development according to the invention, the substrate surface of a first substrate and the substrate surface of a second substrate are amorphized. In a special embodiment according to the invention, the amorphization of two substrate surfaces in the same unit is carried out in particular simultaneously in order to produce the same amorphous layers with the same process parameters. The amorphous layers that are produced preferably have the same thickness $d_1$ of the first amorphous layer of the first substrate and $d_2$ of the second amorphous layer of the second substrate. The ratio of the thicknesses $d_1/d_2$ of the two amorphous layers, in particular produced simultaneously, is $0.6<d_1/d_2<1.4$, preferably $0.7<d_1/d_2<1.3$, even more preferably $0.8<d_1/d_2<1.2$, most preferably $0.9<d_1/d_2<1.1$, and all the more preferably $0.99<d_1/d_2<1.01$.

The substrate surfaces have a slight, but in particular not insignificant, roughness before, during and after the amorphization. In a preferred embodiment, the roughness of the substrate surface during the amorphization is reduced and has a minimum after the amorphization. The roughness is indicated either as a mean roughness, quadratic roughness or as an averaged depth of roughness. The determined values for the mean roughness, the quadratic roughness, and the averaged depth of roughness are different in general for the same measurement section or measurement surface, but lie in the same order of magnitude range. A measurement of the surface roughness is done with one of the measuring devices (known to one skilled in the art), in particular with a profilometer and/or an atomic force microscope (AFM). In this case, the measuring surface is in particular 200 μm×200 μm. Therefore, the following numerical value ranges for the roughness are defined either as values for the mean roughness, the quadratic roughness or for the averaged depth of roughness. According to the invention, the roughness of the substrate surface before the amorphization is in particular less than 10 nm, preferably less than 8 nm, even more preferably less than 6 nm, most preferably less than 4 nm, and all the more preferably less than 1 nm. The roughness of the substrate surface after the amorphization is in particular less than 10 nm, preferably less than 8 nm, even more preferably less than 6 nm, most preferably less than 4 nm, and all the more preferably less than 1 nm.

The amorphization is preferably carried out by particle collision with the substrate surface. The particles are either charged particles or uncharged particles. The acceleration is preferably carried out with charged particles (ions) since charged particles can technically be accelerated more easily.

According to the invention, the ions are preferably also used in the purification of the substrate surface. According to the invention, therefore, in particular a purification of the substrate surface, in particular an oxide removal, is combined with the amorphization. If the substrates have been purified, in particular immediately before the amorphization, the method according to the invention can, however, also be used exclusively for the production of the amorphous layer.

The ratio between the entire surface F of the substrate and the purified surface f is referred to as a degree of purity r. Before the bonding process according to the invention, the degree of purity is in particular to be greater than 0, preferably greater than 0.001, even more preferably greater than 0.01, most preferably greater than 0.1, and all the more preferably 1.

$$r=f/F$$

The purification and/or the amorphization preferably take place in a vacuum chamber as a process chamber. In this case, the vacuum chamber can be evacuated to be less than 1 bar, preferably less than 1 mbar, even more preferably less than $10^{-3}$ mbar, most preferably less than $10^{-5}$ mbar, and all the more preferably less than $10^{-8}$ mbar. In particular before the ions are used for amorphization, the vacuum chamber is evacuated preferably to a pre-established pressure, and is even more preferably completely evacuated. In particular, the proportion of oxygen in the process chamber is greatly reduced so that a renewed oxidation of the substrate surfaces is not possible.

According to the invention, in particular the following gases and/or gas mixtures are ionized for the amorphization:
Atomic gases, in particular
  Ar, He, Ne, Kr,
Molecular gases, in particular
  $H_2$, $N_2$, CO, $CO_2$,
Gas mixtures, in particular
  Forming gas FG (argon +hydrogen) and/or
  Forming gas RRG (hydrogen+argon) and/or
  Forming gas NFG (argon+nitrogen) and/or
  Hydrogen The gas mixtures used have in particular the following composition

TABLE 1

The table shows a listing of three exemplary gas mixtures: FGx, RFGx, and NFGx with their respective proportions of argon and hydrogen, or argon and nitrogen.

| Gas Mixture FG | Ar (%) | H (%) | Gas Mixture RFG | H (%) | Ar (%) | Gas Mixture NFG | Ar (%) | N2 (%) |
|---|---|---|---|---|---|---|---|---|
| FG 0 | 100 | Atmosphere (10 sccm) | RFG 0 | 100 | Atmosphere (10 sccm) | NFG 0 | 100 | Atmosphere (10 sccm) |
| FG 1 | 96 | 4 | RFG 1 | 100 | 0 | NFG 1 | 95 | 5 |
| FG 2 | 90 | 10 | RFG 2 | 95 | 5 | NFG 2 | 90 | 10 |
| FG 3 | 80 | 20 | RFG 3 | 90 | 10 | NFG 3 | 80 | 20 |
| FG 4 | 70 | 30 | RFG 4 | 70 | 30 | NFG 4 | 70 | 30 |
| FG 5 | 50 | 50 | RFG 5 | 50 | 50 | NFG 5 | 50 | 50 |

The ions are produced in an ionization process. The ionization process preferably takes place in an ion chamber. The ions that are produced leave the ion chamber and are preferably accelerated by an electric field and/or a magnetic field. Also, a deflection of the ions by electric and/or magnetic fields is conceivable. The ions strike the substrate surface in an ion beam. The ion beam is distinguished by a mean ion density.

According to an embodiment of the invention, the angle of incidence between the substrate surface and the ion beam can be freely selected and set. The angle of incidence is defined as the angle between the substrate surface and the ion beam. The angle of incidence lies in particular between 0° and 90°, preferably between 25° and 90°, even more preferably between 50° and 90°, most preferably between 75° and 90°, and all the more preferably at exactly 90°. The impact energy of the ions on the substrate surface can be controlled by the angle of incidence of the ion beam.

The amorphization can be controlled by the impact energy. In addition, the removal of contaminants, in particular oxides, can be controlled by the angle of incidence (and the associated impact energy of the ions on the substrate surface). In addition, the exact selection of the angle of incidence makes possible the control of the removal rate and thus the surface roughness. The angle of incidence is therefore selected in particular so that amorphization, removal of contaminants, in particular oxides, and surface smoothing are maximized for the desired result. Maximization is defined in particular as a complete removal of contaminants, in particular oxides, a still further, in particular complete, smoothing of the surface (i.e., a reduction of the roughness value to zero), as well as an optimal, in particular thick, amorphized layer.

The control of the amorphization is implemented according to another embodiment of the invention by setting the kinetic energy of the accelerated particles, in particular ions. The kinetic energy of the particles is set in particular to be between 1 eV and 1,000 keV, preferably between 1 eV and 100 keV, even more preferably between 1 eV and 10 keV, most preferably between 1 eV and 1 keV, and all the more preferably between 1 eV and 200 eV.

The current density (the number of particles, in particular ions, per unit of time and area) is selected in particular to be between 0.1 mA/cm$^2$ and 1,000 mA/cm$^2$, preferably between 1.0 mA/cm$^2$ and 500 mA/cm$^2$, even more preferably between 50 mA/cm$^2$ and 100 mA/cm$^2$, most preferably between 70 mA/cm$^2$ and 80 mA/cm$^2$, and all the more preferably 75 mA/cm$^2$.

The treatment time is selected in particular to be between 1 s and 200 s, preferably between 10 s and 200 s, even more preferably between 50 s and 200 s, and most preferably between 100 s and 200 s.

Bonding

The bonding is done in particular in a separate bonding chamber, whereby the bonding chamber, preferably in a cluster unit, is connected integrally to the process chamber for amorphization, even more preferably with a steadily maintained evacuation, and can be moved from the process chamber into the bonding chamber.

After the amorphization according to the invention of at least one of the two substrate surfaces, in particular an alignment of the two substrates to one another is implemented. The alignment is preferably implemented by alignment units (aligners) and based on alignment marks.

After the two substrates are aligned with respect to one another, in particular contact is made. The contact is preferably begun in the center and is continued radially outward until the contact is complete. With this type of contact, a displacement of gases is ensured. In addition, the two substrates are bonded to one another with as little distortion as possible.

The contact preferably produces a prefixing, in particular a prebonding. The prebonding is distinguished by a binding strength of between 0.01 J/m$^2$ and 2.5 J/m$^2$, preferably between 0.1 J/m$^2$ and 2 J/m$^2$, even more preferably between 0.5 J/m$^2$ and 1.5 J/m$^2$, and most preferably between 0.8 J/m$^2$ and 1.2 J/m$^2$. The prebonding does not necessarily lead to a complete contact of the two substrate surfaces.

In another step according to the invention, the actual bonding process of the pre-bonded substrates is carried out. The actual bonding process is comprised in particular of the action of a force and/or temperature. The bonding temperature according to the invention is in particular less than 200° C., preferably less than 150° C., even more preferably less than 100° C., most preferably less than 100° C., and all the more preferably less than 50° C. The bonding force according to the invention is in particular greater than 0.01 kN, preferably greater than 0.1 kN, even more preferably greater than 1 kN, most preferably greater than 10 kN, and all the more preferably greater than 100 kN. The corresponding pressure areas are produced by standardizing the bonding force according to the invention on the surface of the substrates. The substrates can have any shape. In particular, the substrates are round and are characterized across the diameter according to the industry standard. The substrates can have any shape but are preferably circular. For substrates, in particular the so-called wafers, the industry-standard diameters are 1 inch, 2 inches, 3 inches, 4 inches, 5 inches, 6 inches, 8 inches, 12 inches and 18 inches. In principle, however, the embodiment according to the invention can handle any substrate, independently of its diameter.

According to the invention, pressure loading causes the substrate surfaces to approach each other in the boundary layer (formed along the contact surface of the substrate surfaces) at which no contact is yet made by the prebonding. The approach of the substrate surfaces results in a continuous reduction in size and an ultimate closure of cavities. According to the invention, in this case, the amorphization plays a decisive role, since a surface-isotropic electrostatic attraction is created by the amorphous state. Since the amorphous layers of the substrate surfaces that make contact with one another are both not crystalline, it is not necessary to take into account a suitable contact that continues onto the crystal lattice. The contact of two substrate surfaces with amorphous layers thus results in producing a new, larger, amorphous layer. The transition is configured in a flowing manner and is characterized according to the invention primarily by the complete disappearance of a boundary layer.

The thickness of the entire bonded amorphous layer, in particular immediately after the bonding process according to the invention, is in particular less than 100 nm, preferably less than 50 nm, even more preferably less than 10 nm, most preferably less than 5 nm, and all the more preferably less than 2 nm.

The bonding strength is influenced in particular by three decisive parameters, namely The thickness of the amorphous layer, The roughness, The number of incorporated ions that have a negative effect, and The bonding force.

According to the invention, the bonding strength in particular increases with increasing thickness of the amorphous layer. The thicker the amorphous layer, the larger the number of randomly arranged atoms. The randomly arranged atoms are not subject to any long-range and/or short-range parameters, and the cavities are correspondingly easily filled by the above-mentioned processes, in particular diffusion and approach by pressure loading, since they do not have to be adapted to a regulated lattice, The contact surface and thus the bonding strength are increased by the filling. The increase of the contact surface is identified as a decisive parameter for the bonding strength. If the mean thickness of the amorphous layer is less than the mean roughness, not enough atoms of the amorphous phase are available to close the cavities. In contrast, it must be mentioned that a substrate surface with a very slight roughness also has correspondingly small cavities. That is to say, the slighter the roughness of a substrate surface, the smaller the thickness of the amorphous layer can also be in order to obtain a desired bonding result. A correspondingly thick amorphous layer is achieved according to the invention by a correspondingly high ionization energy, which results in the fact that the ions can penetrate as deeply as possible into the substrate.

The effects of the roughness are defined analogously. The greater the roughness, the more difficult the approach of the substrate surfaces is and the more energy the atoms of the amorphous substrate surfaces must expend in order to fill the cavities and thus to maximize the contact surface.

The bonding strength is also a function of the purity of the amorphous layer. Any stored atom or ion can lead in particular to destabilization, in particular reduction of the bonding strength. The ions that are used for amorphization can therefore also have a negative influence on the bonding strength, in particular if they remain in the amorphous layer after the amorphization. Therefore, in addition to a correspondingly low ionization energy, a lowest possible current density and treatment time are also desired.

If the current intensity is multiplied by the treatment time, the ions that strike the substrate surface within the treatment time per unit surface section are obtained. In order to minimize this number, the current density and/or the treatment time can be reduced. The fewer ions per unit surface strike the substrate surface, the fewer ions are incorporated in the amorphous layer. Primarily the particles that cannot enter into any bond with the material to be amorphized have negative effects on the bonding strength and are present only as defects, in particular point defects. These primarily include the noble gases, but also molecular gases.

In particular, according to the invention, the use of gases or gas mixtures, whose ions are responsible for a reinforcement of the bonding interface, in particular by forming new phases, is conceivable, A preferred option would be the use of ionized nitrogen. Which nitrates the amorphous layer.

Analogous considerations apply for all other types of elements that form a compound, in particular a metal, covalent or ionic bond with the material of the amorphous layer. In order to be able to reduce the current density, in particular substrate surfaces that already have a minimal roughness are preferred. The smoother the substrate surface, the fewer and less energetic ions are required according to the invention for the reduction of roughness. As a result, a reduction of the ionization energy and/or the ion stream and thus the number of ions per unit surface is made possible, which in turn leads to a lower number of incorporated ions and consequently to fewer defects and ultimately to an increased bonding strength.

Bonding strength is a function of bonding force, since a higher bonding force leads to a greater approach of the substrate surfaces and thus to a better contact surface. The higher the bonding force, the more easily the substrate surfaces approach one another, and the cavities are thus closed by locally deformed areas.

Heat Treatment

A heat treatment, which is separate in particular from the amorphization process, is carried out in particular either during and/or after the bonding in the bonder or after the bonding in an external heat treatment module (in particular integrated into the cluster). The heat treatment module can be a hot plate, a heating tower, a furnace, in particular a continuous furnace or any other type of heat-generating device.

The heat treatment takes place in particular at temperatures of less than 500° C., preferably less than 400° C., even more preferably less than 300° C., most preferably less than 200° C., and all the more preferably less than 100° C.

The time period of the heat treatment is selected in particular in such a way that after the heat treatment, the thickness of the amorphous residual layer according to the invention is less than 50 nm, preferably less than 25 nm, even more preferably less than 15 nm, most preferably less than 10 nm, and all the more preferably less than 5 nm. The residual layer thickness never completely disappears, in particular in most cases studied, since complete conversion of the amorphous layer is possible only with a complete adaptation of the converted crystal lattice of the two substrate surfaces. Since a complete adaptation is rather unlikely for reasons of energy and geometry, a residual layer thickness that is different from zero remains in most cases that are described according to the invention.

In particular, during and/or after bonding and/or in the case of heat treatment, a phase conversion from the amorphous state into the crystalline state is implemented.

In a quite preferred embodiment according to the invention, the above-mentioned process parameters are selected in such a way that a complete conversion of the amorphous layer into the crystalline phase is carried out.

According to the invention, the purity of the converted material according to an advantageous embodiment is selected in percent by mass (m %) in particular to be greater than 95 m %, preferably greater than 99 m %, even more preferably greater than 99.9 m %, most preferably greater than 99.99 m %, and all the more preferably greater than 99.999 m %. Because of the high purity of the substrate material, an even better bonding result is achieved.

Additional advantages, features, and details of the invention follow from the description below of embodiments that are preferred and based on the drawings.

BRIEF DESCRIPTION OF THE DRAWINGS

In the figures, features that are the same or that have the same effect are identified with the same reference numbers.

DETAILED DESCRIPTION OF THE INVENTION

Figure 1:
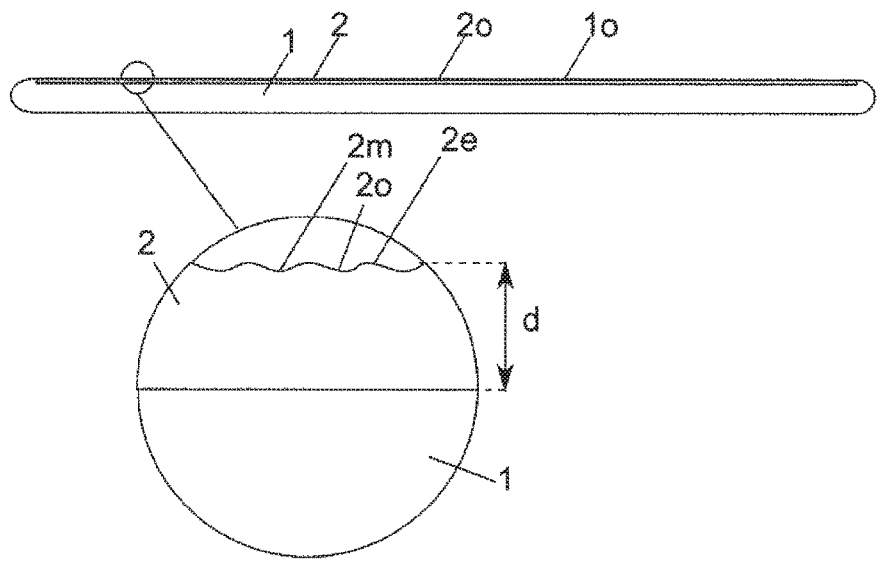
FIG. 1 a diagrammatic cross-sectional depiction, not to scale, of an embodiment of a substrate, treated according to the invention, in a first process step (a.morphization) of an embodiment of a method according to the invention, FIG. 2 a diagrammatic cross-sectional depiction, not to scale, of a second. process step (making contact/prebonding) of an embodiment of a method according to the invention, FIG. 3 a diagrammatic cross-sectional depiction, not to scale, of a third process step (bonding), FIG. 4 a diagrammatic cross-sectional depiction, not to scale, of a fourth process step (heat treatment), and FIG. 5 a diagrammatic cross-sectional depiction, not to scale, of a unit/device for producing an amorphous layer.

FIG. 1 shows a diagrammatic cross-sectional depiction, not to scale, of a first substrate 1 with an amorphous layer 2 that is produced according to the invention at a substrate surface 1o. The amorphous layer 2 in general also has a rough surface 2o. The roughness is preferably reduced to a minimum during the removal of an oxide or other products. The amorphous layer 2 extends from the substrate surface to over a depth (thickness d) into the substrate 1.

Figure 2:
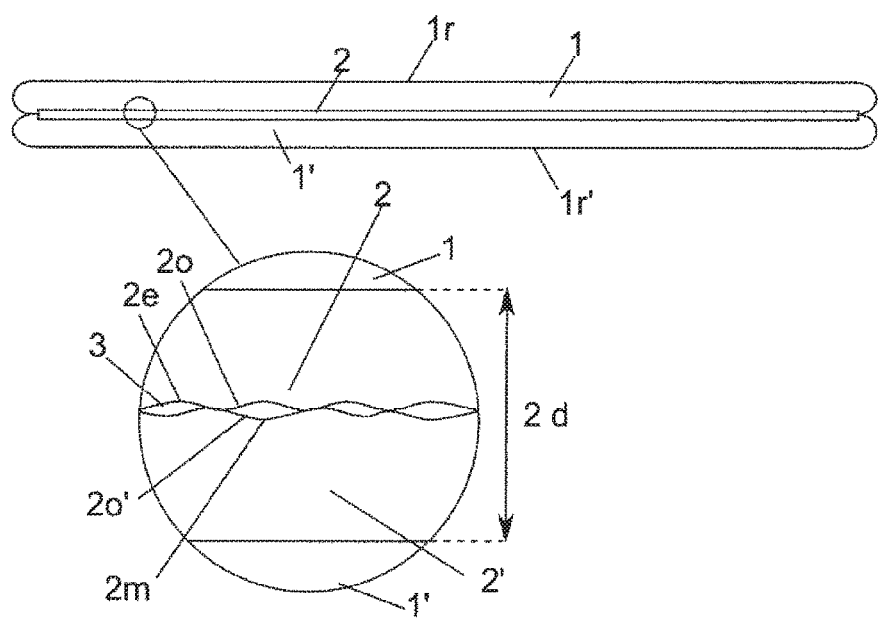
Figure 3:
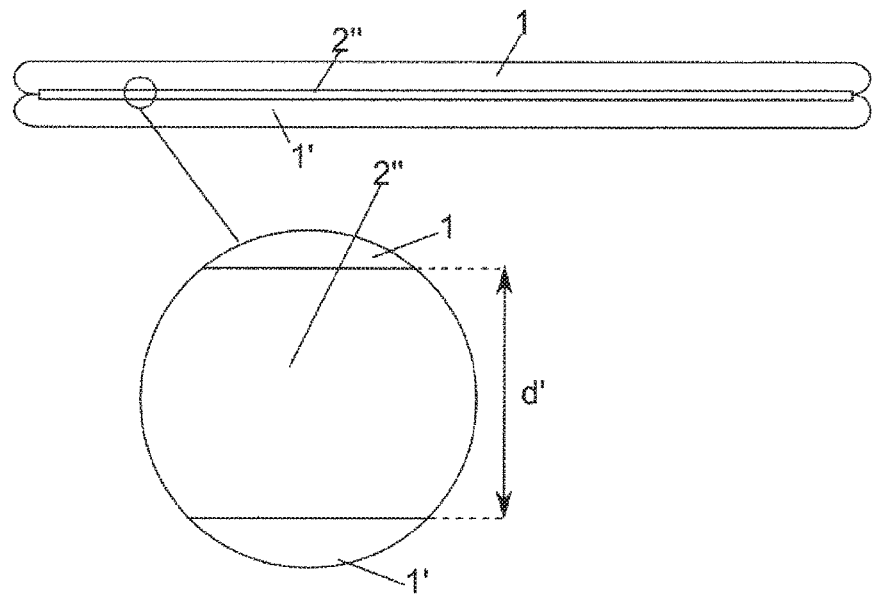

FIG. 2 shows a diagrammatic cross-sectional depiction, not to scale, of a prebonding of two substrates 1, 1' that are treated according to FIG 1. The prebonding process is distinguished by substrate surfaces 1o (contact surfaces) being brought into contact along surfaces 2o, 2o' of the amorphous layers 2, 2'. The contact is made in this case in particular at maximum points 2e of the surfaces 2o, 2o'. Because of a roughness that is different from zero but in particular even greatly reduced by the amorphization according to FIG. 1, the result in this case is a formation of cavities 3. In quite especially preferred cases, as many maximum points 2e as possible partially, in particular completely, extend into the minimum points 2m in order to minimize the number of cavities 3 produced or their volumes as early as during the prebonding process.

Bringing the surfaces 2o, 2o' into contact is completed by a bonding process according to the invention, in particular by force loading crosswise to the substrate surfaces 1o, 1o' on the reverse sides 1r, 1r' of the substrates 1, 1', and the (totaled) thicknesses d of the common amorphous layer 2" formed from the amorphous layers 2, 2' are reduced to a (common) layer thickness d'. At this time, a distinction can preferably no longer be made between the bonded surfaces 1o of the substrates 1, 1' that are bonded to one another. This property is also mentioned as a specific feature of the embodiment according to the invention and is used for differentiation from other technologies. According to modern technical knowledge, it is not possible to produce an amorphous layer within a substrate without an alteration of the (crystalline) structure in the transfer path of the ions. By studying the structure before or after the amorphous (residual) layer, a definitive identification of the process according to the invention is conceivable. If the structures before or after the amorphous residual layer have not been definitively altered by ion bombardment, the production of the buried amorphous layer must be done by the bonding process according to the invention.

The force loading results in particular in an approach of the atoms present in the amorphous phase and arranged at the surfaces 1o. Because of the comparatively already small dimensions (in particular reduced by the amorphization) of the cavities 3, a deformation of the maximum points 2e by a pure shifting of the atoms, in particular supported by diffusion processes, is enough to virtually completely close the cavities 3. Plasticization of the structure is therefore not carried out by plasticization processes known from plasticity theory, such as dislocation mobility or twinning, but rather at least primarily, and preferably exclusively, by movement of the individual atoms caused or supported by approach and/or shifting and/or diffusion.

Figure 4:
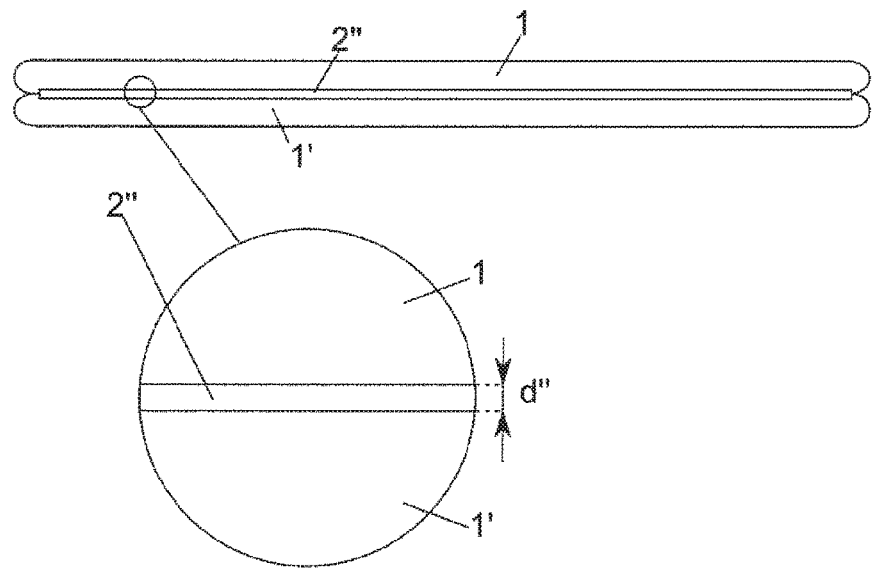

In another process step of the invention according to FIG. 4, conversion of the amorphous layer 2", produced in particular at least primarily by recrystallization, is carried out. The conversion, in particular recrystallization, leads to a continuous reduction of the layer thickness d' up to a final layer thickness d" according to the invention, which according to a quite preferred embodiment according to the invention is equal to 0 (zero). The ratio between d"/d and/or d"/d' is less than or equal to 1, preferably less than 0.5, even more preferably less than 0.25, most preferably less than 0.1, and all the more preferably equal to 0. From this is produced in particular a complete, almost defect-free crystalline transition between the two substrates 1, 1'. This can come about even during and/or shortly after the bonding, in particular even in the bonding chamber, in this case, the heating device of a bonder is used during bonding for heating the substrate stack (heat treatment).

Figure 5:
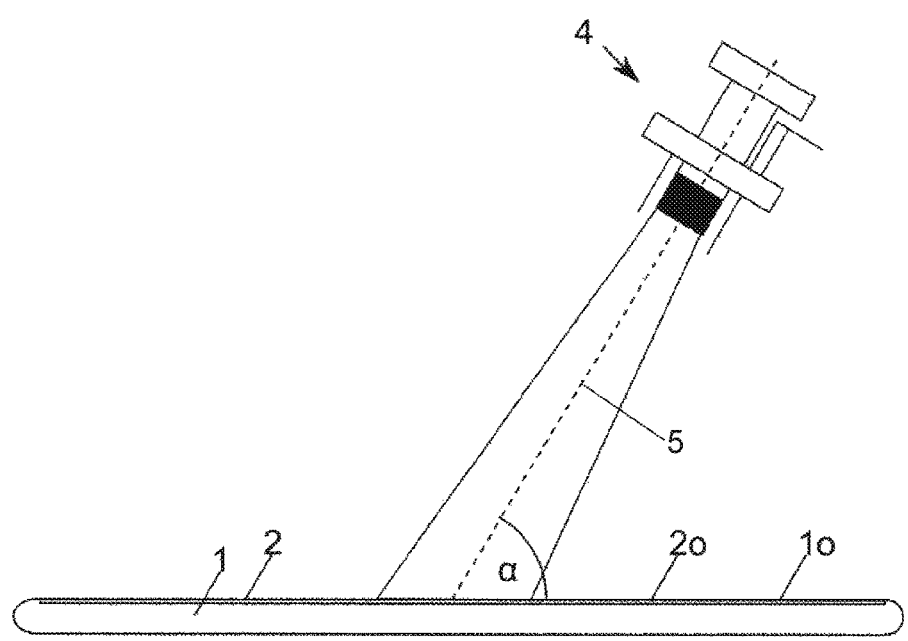

FIG. 5 shows an ion source 4, which accelerates the ions of an ion beam 5 at an angle of incidence α to the substrate surface 1o, on the substrate surface 2o.

LIST OF REFERENCE SYMBOLS 1, 1' Substrates
1o, 1o' Substrate surfaces
1r, 1r' Reverse sides
2, 2', 2" Amorphous layers
2o, 2o' Surface
2e Maximum points
2m Minimum points
3 Cavities
4 Ion source
5 Ion beam
d, d', d" Thicknesses
α Angle of incidence Having described the invention, the following is claimed:

1. A method for surface treatment of an at least primarily crystalline substrate surface of a substrate, the method comprising:
    amorphizing the substrate surface without deposition of a material to form an amorphous layer for bonding at the substrate surface of the substrate, the amorphous layer having a thickness d>0 nm, the amorphous layer resulting from a phase conversion of a material of the substrate.

2. The method according to claim 1, wherein the amorphizing is carried out up to a thickness d<100 nm of the amorphous layer.

3. The method according to claim 1, wherein the amorphizing is performed such that the mean roughness of the substrate surface decreases.

4. The method according to claim 3, wherein the mean roughness of the substrate surface decreases to a mean roughness of less than 10 nm.

5. The method according to claim 1, wherein the amorphizing is produced by collision of particles with the substrate surface.

6. The method according to claim 5, further comprising: ionizing a gas and/or a gas mixture to form said particles.

7. The method according to claim 5, wherein said particles are accelerated.

8. The method according to claim 5, wherein kinetic energy of the particles is between 1 eV and 1,000 keV.

9. The method according to claim 5, wherein the current density of the particles is between 0.1 mA/cm$^2$ and 1,000 mA/cm$^2$.

10. The method according to claim 1, wherein the amorphizing is performed in a process chamber, which is evacuated before the amorphizing.

11. The method according to claim 10, wherein the process chamber is evacuated before the amorphizing to a pressure of less than 1 bar.

12. A method for bonding a first substrate, treated according to the method of claim 11, to a second substrate, treated according to the method of claim 1.

13. A method according to claim 12, wherein a heat treatment is performed during and/or after the bonding.

14. A device for surface treatment of a substrate surface of a substrate, the device comprising:
    a process chamber for receiving the substrate; and
    means for amorphizing the substrate surface without deposition of a material to form an amorphous layer at the substrate surface, the amorphous layer having a thickness d>0 nm, the amorphous layer resulting from a phase conversion of a material of the substrate.

15. The device according to claim 14, further comprising:
    an ion chamber in which a gas and/or a gas mixture is ionized to form particles for collision with the substrate surface to form the amorphous layer.

* * * * *